United States Patent [19]
Lee

[11] Patent Number: 6,004,846
[45] Date of Patent: Dec. 21, 1999

[54] METHOD FOR MANUFACTURING DRAM CAPACITOR USING HEMISPHERICAL GRAINED SILICON

[75] Inventor: Hal Lee, Taipei, Taiwan

[73] Assignee: United Microelectronics Corp., Taiwan, Switzerland

[21] Appl. No.: 08/993,520

[22] Filed: Dec. 18, 1997

[30] Foreign Application Priority Data

Oct. 18, 1997 [TW] Taiwan ................................. 86115360

[51] Int. Cl.⁶ .............................................. H01L 21/8242
[52] U.S. Cl. .......................................... 438/255; 438/964
[58] Field of Search ................................... 438/253, 255, 438/396, 398, 634, 665, 964

[56] References Cited

U.S. PATENT DOCUMENTS

| | | | |
|---|---|---|---|
| 5,340,765 | 8/1994 | Dennison et al. | 438/964 |
| 5,354,705 | 10/1994 | Mathews et al. | 438/398 |
| 5,597,756 | 1/1997 | Fazan et al. | 438/964 |
| 5,650,351 | 7/1997 | Wu | 438/398 |
| 5,763,286 | 6/1998 | Figura et al. | 438/255 |
| 5,846,872 | 12/1998 | Sandhu et al. | 438/255 |

*Primary Examiner*—Chandra Chaudhari
*Attorney, Agent, or Firm*—Rabin & Champagne, P.C.

[57] ABSTRACT

A method for manufacturing DRAM capacitor comprising the steps of providing a substrate having a transistor already formed thereon and an insulating layer covered on top, wherein the insulating layer has an opening exposing one source/drain region of the transistor. Next, a first conductive layer, a first hemispherical grained silicon layer and a material layer are sequentially formed over the insulating layer and the source/drain region exposed through the contact opening, and then followed by a patterning operation. After that, a second conductive layer, a second hemispherical grained silicon layer are sequentially formed over the device, and then etched to expose the insulating layer and the material layer. Subsequently, the material layer is removed to expose the first hemispherical grained silicon layer forming a lower electrode. Finally, a dielectric layer and an upper electrode are sequentially formed over the lower electrode. The characteristic of this invention includes an effective increase in the surface area of the capacitor, the lowering of profile height of the capacitor, and the prevention of spike formation and its associated problems.

26 Claims, 4 Drawing Sheets

METHOD FOR MANUFACTURING DRAM CAPACITOR USING HEMISPHERICAL GRAINED SILICON

BACKGROUND OF THE INVENTION

1. Field of Invention

The present invention relates to a method for manufacturing a semiconductor device. More particularly, the present invention relates to the method of manufacturing a crown-shaped dynamic random access memory (DRAM) capacitor.

2. Description of Related Art

Memory is a type of semiconductor devices for registering data and storing numerical information. As microprocessors become more powerful functionally and the amount of software data that needs to be processed becomes very large, the amount of memory necessary for storing the data is also correspondingly greater. In order to satisfy the need for storing large amount of data, production of memory cells that can have a higher level of integration is the driving force behind some of the newly developed techniques in semiconductor manufacture. DRAM is now an extensively used integrated circuit device for data storage.

FIGS. 1A through 1D are cross-sectional views showing the progression of manufacturing steps in the fabrication of a conventional DRAM capacitor. First, as shown in FIG. 1A, a substrate 10 having a transistor (not shown) already formed thereon is provided. Next, a low pressure chemical vapor deposition (LPCVD) method is used to deposit a layer of insulating material over the substrate 10 and the transistor. The insulating layer can be a silicon dioxide layer or a silicon nitride layer. Then, conventional photolithographic and etching techniques are used to pattern the layer of insulating material to form an insulating layer 12 and a contact opening exposing one source/drain region (not shown) of the transistor. Thereafter, a low pressure chemical vapor deposition method is used to deposit a layer of conductive material over the insulating layer 12 and into the contact opening covering the source/drain region (not shown) to form a conductive layer 14a. The conductive material can be an impurities-doped polysilicon layer having a thickness preferably of about 0.5 to 1.5 μm.

Next, as shown in FIG. 1B, conventional photolithographic and etching techniques are used to pattern the conductive layer 14a to form a conductive layer 14b. Subsequently, a hemispherical grained silicon layer 16a is formed over the conductive layer 14b and the insulating layer 12. A low pressure chemical vapor deposition method is used to deposit the hemispherical grained silicon. During the reaction, silane ($SiH_4$) or disilane ($Si_2H_6$) is used as the gaseous source and a temperature between the growth of amorphous silicon and polysilicon is maintained. For example, for silane the temperature is about 550° C. to 590° C. for the direct deposition of silicon.

Next, as shown in FIG. 1C, an anisotropic etching method is used to remove the hemispherical grained silicon above the insulating layer 12 forming a hemispherical grained silicon layer 16b. The hemispherical grained silicon layer 16b and the conductive layer 14b together constitute the lower electrode of a capacitor.

Next, as shown in FIG. 1D, a dielectric layer is formed covering the lower electrode. The dielectric layer 18 can have, for example, an oxide/nitride/oxide triple-layered structure, and deposits by using a low pressure chemical vapor deposition method. Thereafter, a layer of conductive material is deposited over the dielectric layer 18 to form the upper electrode 19 of the capacitor. The conductive layer can be, example, an impurities-doped polysilicon layer formed by using a low pressure chemical vapor deposition method.

However, in the step of etching to remove the hemispherical grained silicon layer above the insulating layer 12 as shown in FIG. 1C, the hemispherical grained silicon layer above the conductive layer 14b will also be removed. Hence, there is the possibility that the conductive layer 14b can be over-etched leading to the formation of spikes (as shown in FIG. 1C). These spikes can easily cause serious current leakage problems, and may affect the operation of the DRAM considerably. Furthermore, surface area produced by the conventional techniques is small, and so the corresponding capacitance of the capacitor is small. In addition, the height 17 of the capacitor produced by a conventional method is rather high, which can lead to processing problems due to the large step height that exists relative to the surrounding areas.

In light of the foregoing, there is a need in the art to provide an improved method of forming DRAM capacitor.

SUMMARY OF THE INVENTION

Accordingly, the present invention is directed to provide a DRAM capacitor that can prevent the formation of spikes, and therefore can effectively prevent current leakage problems. Furthermore, the method of this invention is able to increase the surface area of a capacitor, thereby increasing its capacitance. Another advantage is the flattening of the capacitor's height profile relative to its surrounding areas, hence, problems caused by step height can be reduced.

To achieve these and other advantages and in accordance with the purpose of the invention, as embodied and broadly described herein, the invention provides a method for forming a DRAM capacitor comprising the steps of providing a substrate that has a transistor already formed thereon. Moreover, an insulating layer has already formed over the transistor and the substrate, wherein the insulating layer has a contact opening exposing one source/drain region of the transistor on the substrate. Next, a first conductive layer is formed over the insulating layer and the source/drain region exposed through the contact opening. Then, a first hemispherical grained silicon layer and a material layer are sequentially formed over the first conductive layer. Subsequently, the first conductive layer, the first hemispherical grained silicon layer and the material layer are patterned. Next, a second conductive layer and a second hemispherical grained silicon layer are sequentially formed over the first conductive layer, the first hemispherical grained silicon layer and the material layer.

Thereafter, the second conductive layer and the second hemispherical grained silicon layer are etched until the insulating layer and the material layer are exposed. Then, the material layer is etched until the first hemispherical grained silicon layer is exposed. Subsequently, a dielectric layer is formed over the exposed first hemispherical grained silicon layer, the second hemispherical grained silicon layer, the insulating layer and the second conductive layer. Finally, an upper electrode is formed over the dielectric layer.

In the embodiment of this invention, the material layer and the insulating layer are made from different materials so that the insulating layer can be used as an etching stop layer in a subsequent etching operation. However, the invention should not be restricted by this arrangement. The material layer and the insulating layer can be of the same material. When this is so, an etching stop layer, which has a material composition different from the material layer, can be added in between the first conductive layer and the insulating layer. Consequently, subsequent etching operation can be stopped on reaching this etching stop layer. To incorporate the etching stop layer, a layer of the etching stop material can be deposited over the insulating layer after the insulating layer is formed over the substrate. Then, photolithographic and etching operations can be carried out to form a contact opening in the insulating layer. Finally, an opening in the etching stop layer exposing the source/drain region can be formed.

The first characteristic of this invention is that the method used for forming the capacitor is able to prevent the formation of spikes in the lower electrode, thereby avoiding problems caused by the leakage of current from the spiky areas.

The second characteristic of this invention is that the method is able to produce a capacitor that has a larger surface area, thereby producing a larger capacitance. Furthermore, the capacitor has a somewhat low profile, hence able to avoid problems caused by a large step height relative to the surrounding areas.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
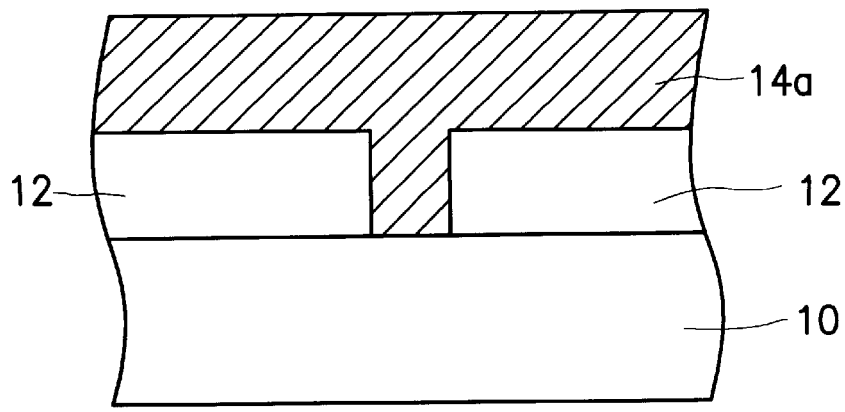
FIGS. 1A through 1D are cross-sectional views showing the progression of manufacturing steps in the fabrication of a conventional DRAM capacitor.
Figure 1B:
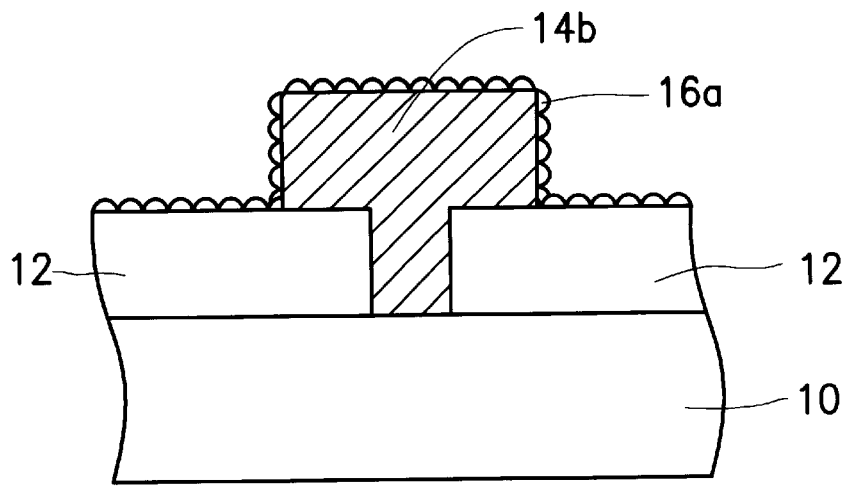
Figure 1C:
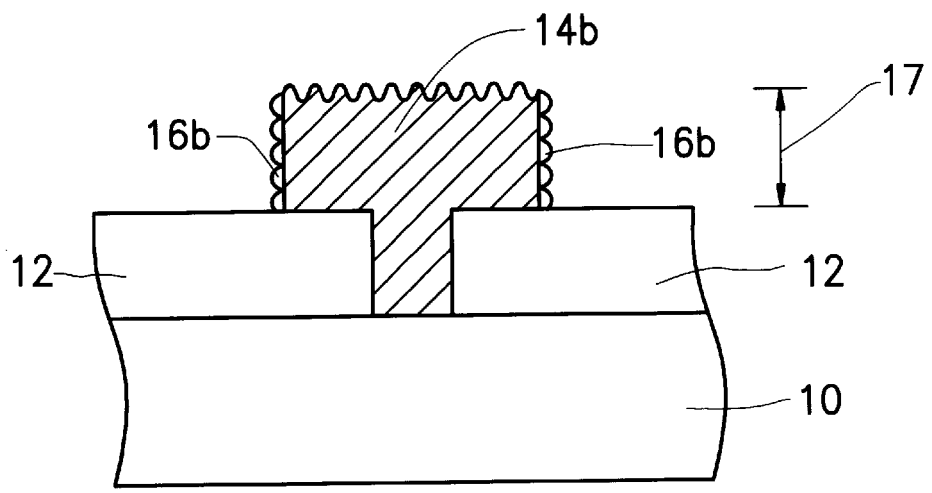
Figure 1D:
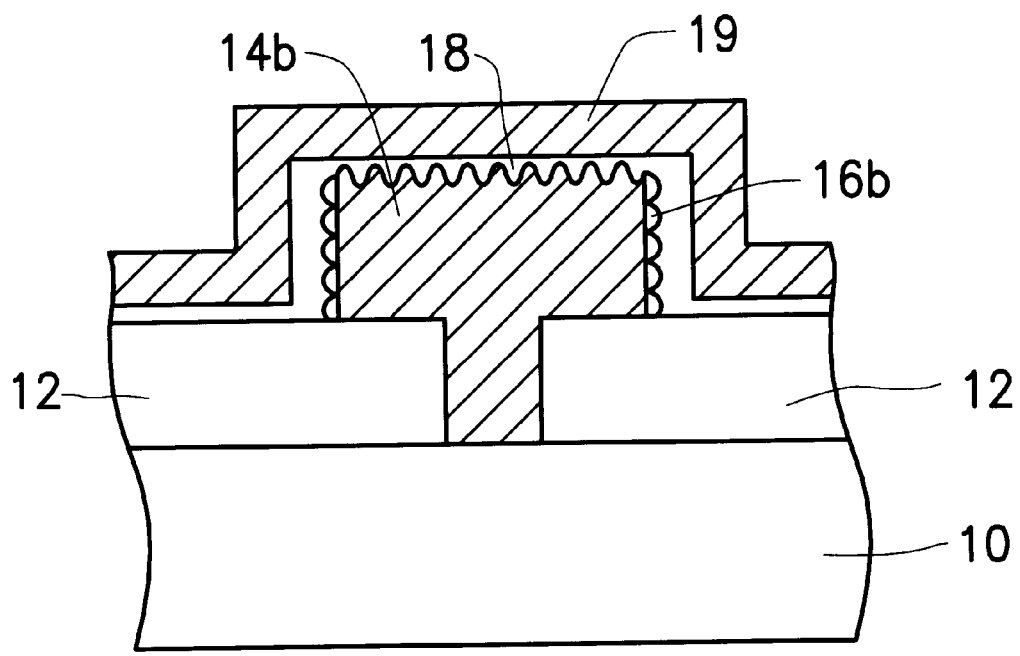

Reference will now be made in detail to the present preferred embodiments of the invention, examples of which are illustrated in the accompanying drawings. Wherever possible, the same reference numbers are used in the drawings and the description to refer to the same or like parts.

Figure 2A:
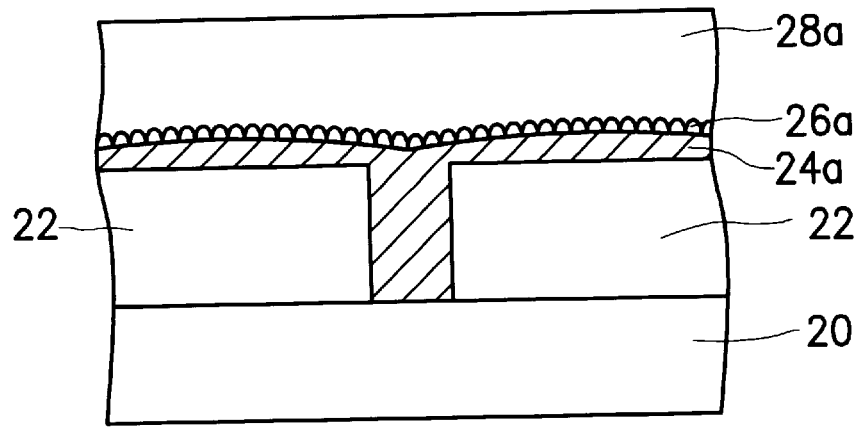
FIGS. 2A through 2F are cross-sectional views showing the progression of manufacturing steps in the fabrication of a DRAM capacitor according to one preferred embodiment of this invention.

FIGS. 2A through 2F are cross-sectional views showing the progression of manufacturing steps in the fabrication of a DRAM capacitor according to one preferred embodiment of this invention. First, as shown in FIG. 2A, a substrate 20 having a transistor (not shown) already formed thereon is provided. Next, a low pressure chemical vapor deposition (LPCVD) method is used to deposit a layer of insulating material over the substrate 20 and the transistor. The insulating layer can be a silicon dioxide layer or a silicon nitride layer. Then, conventional photolithographic and etching techniques are used to pattern the layer of insulating material to form an insulating layer 22 and a contact opening exposing one source/drain region (not shown) of the transistor. Thereafter, a low pressure chemical vapor deposition method is used to deposit a layer of conductive material over the insulating layer 22 and into the contact opening covering the source/drain region (not shown) to form a first conductive layer 24a. The conductive material can be an impurities-doped polysilicon layer having a thickness preferably of about 0.5 to 1.5 μm. Subsequently, a first hemispherical grained silicon layer 26a is formed over the first conductive layer 24b. A low pressure chemical vapor deposition method is used to deposit the hemispherical grained silicon. During the reaction, silane ($SiH_4$) or disilane ($Si_2H_6$) is used as the gaseous source and a temperature between the growth of amorphous silicon and polysilicon is maintained. For example, for silane the temperature is about 550° C. to 590° C. for the direct deposition of silicon.

Thereafter, insulating material is deposited over the first hemispherical grained silicon layer 26a to form a material layer 28a. The insulating material can be, for example, silicon nitride or silicon dioxide, and is deposited using a low pressure chemical vapor deposition method. In this invention, the height of the capacitor can be adjusted through depositing a thinner material layer 28a such that problems caused by a difference in step height relative to its surroundings can be avoided. The material layer 28a preferably has a thickness of about 0.2 μm to 0.4 μm. In the embodiment of this invention, the material layer 28a and the insulating layer 22 are made from different materials. Therefore, the insulating layer 22 can be used as an etching stop layer in subsequent etching operation.

However, the invention should not be restricted by this arrangement. The material layer 28a and the insulating layer 22 can be made of the same material. When this is so, an etching stop layer, which has a material composition different from the material layer 28a, can be added in between the first conductive layer 24a and the insulating layer 22. Consequently, subsequent etching operation can be stopped on reaching this etching stop layer. To incorporate the etching stop layer, a layer of the etching stop material can be deposited over the insulating layer 22 after the insulating layer 22 is formed over the substrate. Then, photolithographic and etching operations be carried out to form a contact opening in the insulating layer 22. Finally, an opening in the etching stop layer can be formed to expose the source/drain region.

Figure 2B:
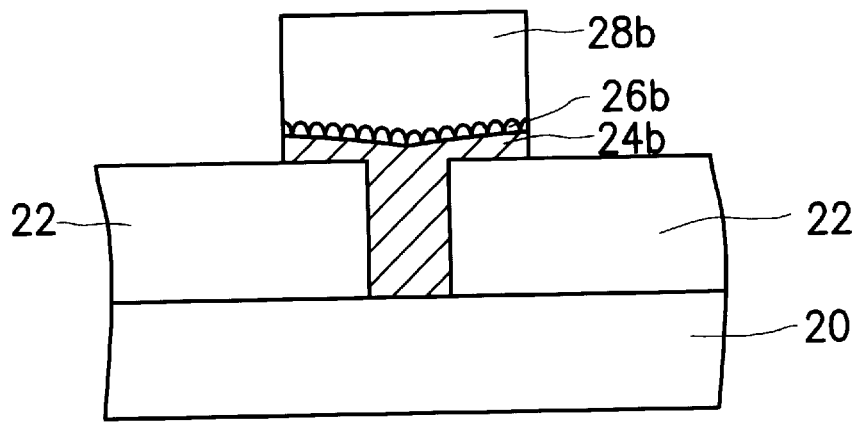

Next, as shown in FIG. 2B, conventional photolithographic and etching techniques are used to pattern the material layer 28a, the first hemispherical grained silicon layer 26a and the first conductive layer 24a, and forming a material layer 28b, a first hemispherical grained silicon layer 26b and a first conductive layer 24b.

Figure 2C:
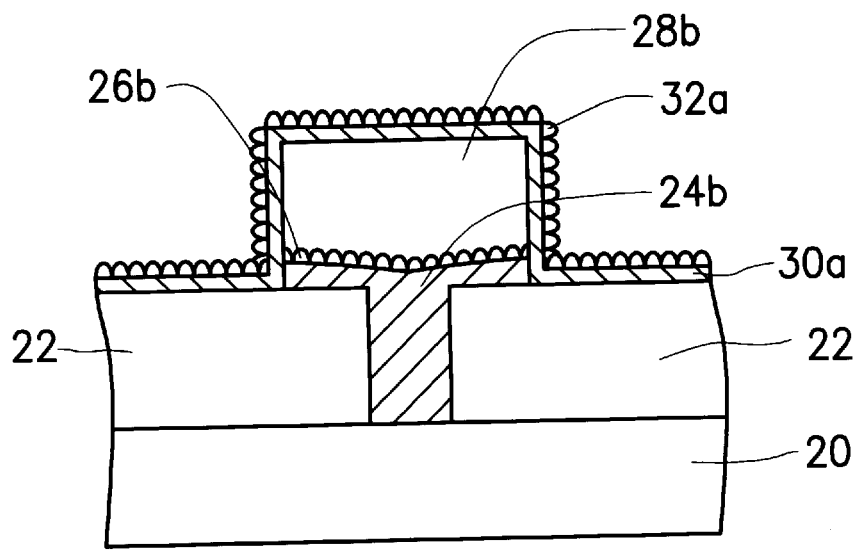

Next, as shown in FIG. 2C, using a low pressure chemical vapor deposition method, a conductive material is deposited over the material layer 28b, the first hemispherical grained silicon layer 26b and the first conductive layer 24b to form a second conductive layer 30a. The second conductive layer 30a can be an impurities-doped polysilicon layer having a thickness preferably of about 0.5 µm to 1.5 µm. In the subsequent step, a second hemispherical grained silicon layer 32a is deposited over the second conductive layer 30a. A low pressure chemical vapor deposition method is used to deposit the hemispherical grained silicon. During the reaction, silane ($SiH_4$) or disilane ($Si_2H_6$) is used as the gaseous source and a temperature between the growth of amorphous silicon and polysilicon is maintained. For example, for silane the temperature is about 550° C. to 590° C. for the direct deposition of silicon.

Figure 2D:
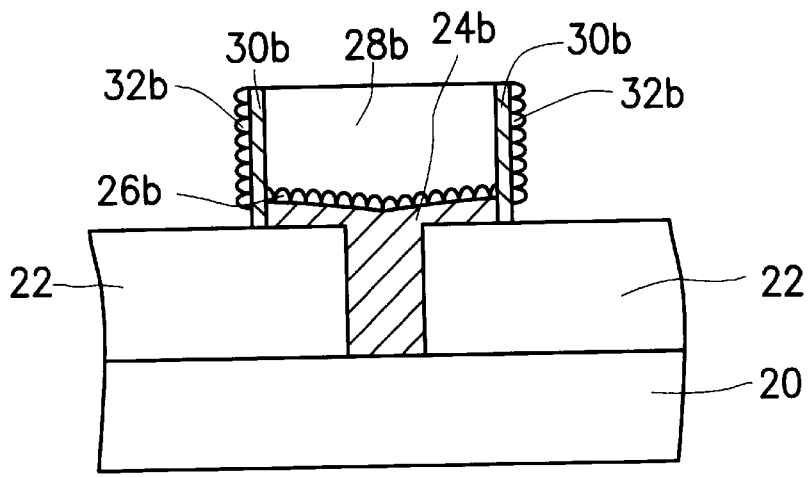

Next, as shown in FIG. 2D, a wet etching method is used to etch the second conductive layer 30a and the second hemispherical grained silicon layer 32a above the insulating layer 22 and the material layer 28b exposing the insulating layer 22 and the material layer 28b while forming a second conductive layer 32b and a second hemispherical grained silicon layer 32b.

Figure 2E:
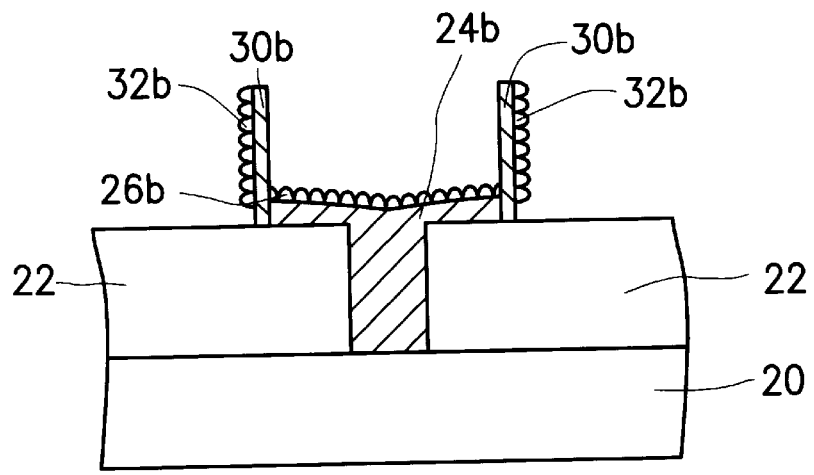

Next, as shown in FIG. 2E, a wet etching method is again used to etch and remove the material layer 28b so that the second hemispherical grained silicon layer 32b, the second conductive layer 30b, the first hemispherical grained silicon layer 26b and the first conductive layer 24b together form the lower electrode of a capacitor. Because there is no direct etching of the hemispherical grained silicon above the first conductive layer 24b in this invention, the hemispherical grained silicon will not be over-etched to reach the first conductive layer 24b. Hence, no spikes are formed in the lower electrode of the capacitor, and no leakage current is generated.

Figure 2F:
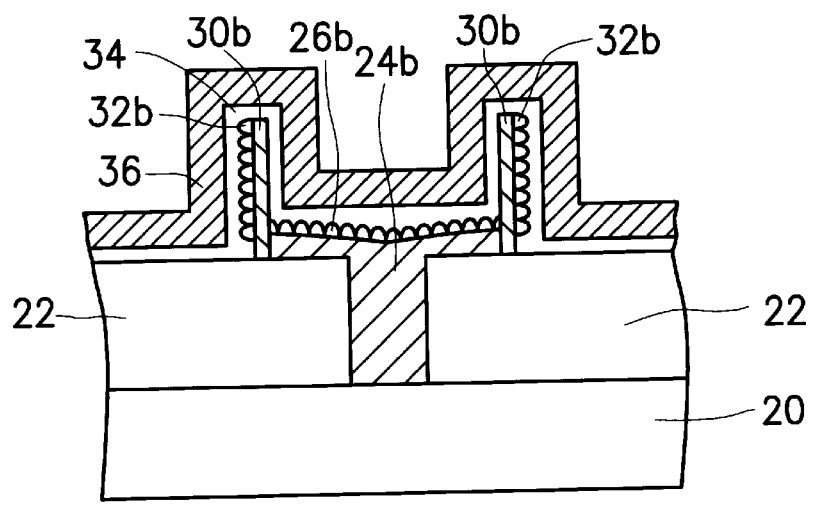

Next, as shown in FIG. 2F, a dielectric layer 34 is deposited over the lower electrode. The dielectric layer 34, for example, can be an oxide/nitride/oxide composite layer formed by depositing using a low pressure chemical vapor deposition method. Finally, conductive material is deposited over the dielectric layer 34 to form the upper electrode 36 of the capacitor. The conductive material can be, for example, impurities-doped polysilicon, and the conductive layer is formed by a deposition process using a low pressure chemical vapor deposition method.

The first characteristic of this invention is that the method used for forming the capacitor is able to prevent the formation of spikes in the lower electrode, thereby avoiding problems caused by the leakage of current from the spiky areas.

The second characteristic of this invention is that the method is able to produce a capacitor that has a larger surface area, thereby producing a larger capacitance. Furthermore, the capacitor has a somewhat lower profile, hence able to avoid problems caused by a large step height relative to the surrounding areas.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing DRAM capacitor comprising the steps of:

providing a substrate having a transistor already formed thereon, and having an insulating layer already formed over the transistor and the substrate, wherein there is a contact opening in the insulating layer exposing one source/drain region of the transistor above the substrate;

forming a first conductive layer over the insulating layer and over the source/drain region exposed through the contact opening;

forming a first hemispherical grained silicon layer and a material layer over the first conductive layer;

patterning the first conductive layer, the first hemispherical grained silicon layer and the material layer;

forming a second conductive layer and a second hemispherical grained silicon layer over the first conductive layer, the first hemispherical grained silicon layer and the material layer;

etching the second conductive layer and the second hemispherical grained silicon layer until the insulating layer and the material layer are exposed;

etching the material layer until the first hemispherical grained silicon layer is exposed;

forming a dielectric layer over the exposed first hemispherical grained silicon layer, the second hemispherical grained silicon layer, the insulating layer and the second conductive layer; and forming an upper electrode over the dielectric layer.

2. The method of claim 1, wherein the step of forming the first conductive layer includes using a low pressure chemical vapor deposition method.

3. The method of claim 1, wherein the step of forming the first hemispherical grained silicon layer includes using a low pressure chemical vapor deposition method.

4. The method of claim 1, wherein the step of forming the material layer includes using a low pressure chemical vapor deposition method.

5. The method of claim 1, wherein the material layer is formed above the first hemispherical grained silicon layer.

6. The method of claim 1, wherein the step of forming the second conductive layer includes using a low pressure chemical vapor deposition method.

7. The method of claim 1, wherein the step of forming the second hemispherical grained silicon layer includes using a low pressure chemical vapor deposition method.

8. The method of claim 1, wherein the second hemispherical grained silicon layer is formed above the second conductive layer.

9. The method of claim 1, wherein the step of etching the second conductive layer and the second hemispherical silicon grained layer includes using a wet etching method.

10. The method of claim 1, wherein the step of etching the material layer includes using a wet etching method.

11. The method of claim 1, wherein the step of forming the dielectric layer includes using a low pressure chemical vapor deposition method.

12. The method of claim 1, wherein the step of forming the upper electrode includes using a low pressure chemical vapor deposition method.

13. The method of claim 1, wherein the step of forming the insulating layer includes depositing silicon dioxide.

14. The method of claim 1, wherein the step of forming the insulating layer includes depositing silicon nitride.

15. The method of claim 1, wherein the step of forming the material layer includes depositing silicon nitride.

16. The method of claim 1, wherein the step of forming the material layer includes depositing silicon dioxide.

17. The method of claim 1, wherein the insulating layer and the material layer are made from two different materials.

18. The method of claim 1, wherein the insulating layer and the material layer are made form the same material.

19. The method of claim 18, wherein the step of providing the substrate further includes forming an etching stop layer above the insulating layer.

20. The method of claim 19, wherein the etching stop layer and the material layer are formed from different materials.

21. The method of claim 19, wherein the step of forming the etching stop layer further includes fabricating an opening exposing the source/drain region.

22. The method of claim 19, wherein the material layer preferably has a thickness of about 0.2 $\mu$m to 0.4 $\mu$m.

23. The method of claim 1, wherein the step of forming the first conductive layer includes depositing impurities-doped polysilicon.

24. The method of claim 19, wherein the first conductive layer preferably has a thickness of about 0.5 $\mu$m to 1.5 $\mu$m.

25. The method of claim 1, wherein the step of forming the second conductive layer includes depositing impurities-doped polysilicon.

26. The method of claim 19, wherein the second conductive layer preferably has a thickness of about 0.5 $\mu$m to 1.5 $\mu$m.

* * * * *